United States Patent
Liebmann et al.

(10) Patent No.: US 7,175,942 B2
(45) Date of Patent: Feb. 13, 2007

(54) METHOD OF CONFLICT AVOIDANCE IN FABRICATION OF GATE-SHRINK ALTERNATING PHASE SHIFTING MASKS

(75) Inventors: Lars W. Liebmann, Poughquag, NY (US); Ioana Graur, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 10/708,055

(22) Filed: Feb. 5, 2004

(65) Prior Publication Data

US 2005/0175906 A1    Aug. 11, 2005

(51) Int. Cl.
G03F 1/00 (2006.01)
G06F 17/50 (2006.01)

(52) U.S. Cl. ............................................. 430/5; 716/21
(58) Field of Classification Search ................ 430/5, 430/311, 394; 716/19–21
See application file for complete search history.

(56) References Cited

U.S. PATENT DOCUMENTS

| | | |
|---|---|---|
| 6,277,527 B1 | 8/2001 | O'Grady et al. |
| 6,523,165 B2 | 2/2003 | Liu et al. |
| 6,541,165 B1 | 4/2003 | Pierrat |
| 6,569,583 B2 | 5/2003 | Cho et al. |
| 6,584,610 B1 | 6/2003 | Wu et al. |
| 6,593,038 B2 | 7/2003 | Cho et al. |
| 6,622,288 B1 | 9/2003 | Wang et al. |
| 6,745,372 B2 * | 6/2004 | Cote et al. ............ 716/2 |
| 6,944,844 B2 * | 9/2005 | Liu ..................... 716/19 |
| 2003/0056190 A1 | 3/2003 | Liu et al. |

OTHER PUBLICATIONS

"Alternating Phase Shifted Mask for Logic Gate Levels, Design and Mask Manufacturing", Lars Liebmann, Ioana Graur, William Liepold, James Oberschmidt, David O'Grady and Denis Riegaill, IBM Microelectronics, 12 pages.
"Alternating Phase Shifted Mask for Logic Gate Levels, Design and Mask Manufacturing", Lars Liebmann, Ioana Graur, William Leipold, James Oberschmidt, David O'Grady, Denis Regaill; IBM Microelectronics, East Fishkill, New York and Burlington, Vermont. SPIE Conference on Optical Microlithography XII, Mar. 1999, vol. 3679, pp. 27-37.

* cited by examiner

*Primary Examiner*—S. Rosasco
(74) *Attorney, Agent, or Firm*—DeLio & Peterson, LLC; Peter W. Peterson; Todd M. C. Li (57) ABSTRACT

A method of designing a layout of an alternating phase shifting mask for projecting an image of an integrated circuit design having a plurality of features to be projected using alternating phase shifting segments, including a gate-shrink region of a transistor having a critical width along a length thereof that extends beyond a diffusion region. The method also provides alternating phase shift design rules based on alternating phase shift design parameters comprising minimum phase width, minimum phase-to-phase spacing, and minimum extension of critical width beyond another feature. The method then includes identifying portions of the integrated circuit layout having a critical width feature that violate the alternating phase shift design rules, and reducing the length that the critical width gate-shrink region feature extends beyond the other diffusion region feature to the minimum extension. An alternating phase shifting mask layout is then generated in conformance with the alternating phase shift design rules.

20 Claims, 6 Drawing Sheets

FIG. 12

METHOD OF CONFLICT AVOIDANCE IN FABRICATION OF GATE-SHRINK ALTERNATING PHASE SHIFTING MASKS

BACKGROUND OF INVENTION

The present invention is directed to the manufacture of masks used in the lithographic production of integrated circuits and, in particular, to the manufacture of alternating phase shifting masks (altPSMs).

As an alternative to chrome on glass (COG) masks used in the lithographic production of integrated circuits, alternating phase shifting masks (altPSMs) have been employed in order to increase the resolution of the critical active area patterns projected. Such increased resolution enables smaller line widths to be exposed on the resist and consequently etched into or deposited on the wafer substrate. This is done by manipulating the electric field vector or phase of the energy beam, e.g., visible or ultraviolet light, used in the lithographic process. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude, but point in exactly the opposite direction, so that any interaction between these light beams results in perfect cancellation. The benefit of using altPSM to image narrow lines with extremely tight dimensional control has been extensively documented.

A commonly used approach to exploit the benefits of altPSM while minimizing the layout impact, is to focus the altPSM design exclusively on the most resolution and line-width-control sensitive portions of an integrated circuit chip layout. One widely used application of this approach is called gate-shrink altPSM in which altPSM segments are applied only to the imaging of the actual transistors in a poly-conductor level, while all the poly-wiring structures (e.g., polysilicon over isolation) are imaged with less layout invasive techniques, such as COG. Limiting the use of altPSM only to the poly-gate, i.e. the region of the layout defined by the polysilicon-diffusion intersection vastly simplifies the design process by limiting the target layout patterns to relatively basic rectangular shapes in well-defined proximity environments.

However, since the transition regions from altPSM to non-altPSM imaged layout portions suffer from poor image quality and dimensional control, it is normally a lithography optimization goal to apply altPSM to large, uninterrupted segments of the layout. One means of balancing the desire of applying altPSM widely to large portions of the layout, while at the same time containing the altPSM shapes to a simple local environment, is described in the SPIE publication "Alternating Phase Shifted Mask for Logic Gate Levels, Design and Mask Manufacturing" authored in part by one of the inventors of the instant application. The drawback of the iterative localization described in this publication is the enormous computational effort and resulting long runtimes involved in repeatedly deriving and checking altPSM solutions.

SUMMARY OF INVENTION

Bearing in mind the problems and deficiencies of the prior art, it is therefore an object of the present invention to formulate a gate-shrink altPSM design solution that localizes the application of altPSM for enhanced lithographic performance.

It is another object of the present invention to provide a method of designing an alternating phase shifting mask for projecting an image of an integrated circuit design that is particularly useful in gate-shrink applications.

A further object of the invention is to provide a method of designing an alternating phase shifting mask that can be automated to quickly and easily avoid phase shifting segment conflict.

Still other objects and advantages of the invention will in part be obvious and will in part be apparent from the specification.

The above and other objects, which will be apparent to those skilled in art, are achieved in the present invention which is directed to a method of designing a layout of an alternating phase shifting mask for projecting an image of an integrated circuit design. The method comprises initially providing a design of an integrated circuit layout having a plurality of features to be projected using alternating phase shifting segments, including a feature having a critical width along a length thereof that extends beyond another feature. The method also provides alternating phase shift design rules based on alternating phase shift design parameters comprising minimum phase width, minimum phase-to-phase spacing, and minimum extension of critical width beyond another feature. The method then includes identifying portions of the integrated circuit layout having a critical width feature that violate the alternating phase shift design rules, and redesigning the critical width feature in the integrated circuit layout that violates the alternating phase shift design rules by reducing the length that the critical width feature extends beyond the other feature to the minimum extension. The method further includes generating an alternating phase shifting mask layout with the reduced length of the critical width feature in conformance with the alternating phase shift design rules.

Preferably, the feature having a critical width along a length thereof comprises a gate-shrink region of a transistor, and the other feature is a diffusion region of a transistor.

In another aspect, the present invention is directed to a method of designing an alternating phase shifting mask for projecting an image of an integrated circuit design comprising providing a design of an integrated circuit layout having a plurality of features to be projected using alternating phase shifting segments, including a feature having a critical width along a length thereof. For each of the features, the method includes determining ideal alternating phase shifting segments shapes to be included in an alternating phase shifting mask for projecting the feature, and identifying a conflict between an alternating phase shifting segment shape for the feature having the critical width along a length thereof and another alternating phase shifting segment shape, prior to fabricating the alternating phase shifting mask. The method then includes restricting length of the alternating phase shifting segment shape for the feature having the critical width along a length thereof to eliminate the conflict, and fabricating the alternating phase shifting mask with the restricted length of the alternating phase shifting segment shape for projecting the feature having the critical width along a length thereof.

Restricting length of the alternating phase shifting segment shape for the feature having the critical width along a length thereof preferably comprises reducing the length of the critical width portion of the feature, in accordance with design rule tolerances. The method may further include restricting length of the other alternating phase shifting segment shape to eliminate the conflict.

The method may also include fabricating a mask with an opaque shape for projecting the portion of the feature length not projected by the restricted length of the alternating phase shifting segment shape. Where the feature having the critical width along a length thereof to be projected has a portion at the critical width and a portion at a wider, non-critical width, and the additional mask has an opaque portion to project the non-critical width portion of the feature.

Where the other alternating phase shifting segment shape is for projecting a gate-shrink region of a transistor, the method may further include restricting length of the other alternating phase shifting segment shape to eliminate the conflict.

In a further aspect, the present invention is directed to a program storage device readable by a machine, tangibly embodying a program of instructions executable by the machine to perform the aforementioned method steps for designing a layout of an alternating phase shifting mask. The integrated circuit layout has a plurality of features to be projected using alternating phase shifting segments, including a feature having a critical width along a length thereof that extends beyond another feature, and the alternating phase shifting mask is to be used to project an image of an integrated circuit design. The present invention is also directed to an article of manufacture comprising a computer-usable medium having computer readable program code means embodied therein for practicing the aforementioned method steps.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–12 of the drawings in which like numerals refer to like features of the invention.

Figure 1:
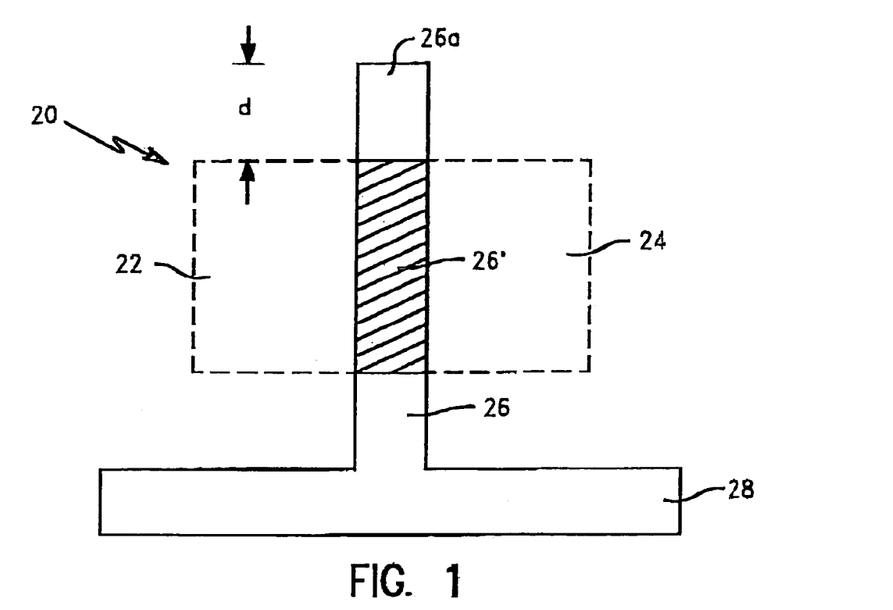
FIG. 1 is a top plan view of one layer of a transistor design to be projected and developed on a resist layer, incorporating non-critical width lines.

The method of designing an alternating phase shifting mask of the present invention is most useful in connection with integrated circuit design features in which the critical width is in the gate region of a transistor. FIG. 1 depicts the region in the vicinity of a transistor design 20 to be projected onto a resist layer, and subsequently developed for productions of the features in an integrated circuit. Transistor design 20 includes a design of a conductive line 28 and, perpendicular to line 28, a design of a line 26 forming a gate region 26' between source and drain diffusion regions 22 and 24, respectively. Line 26 extends beyond the diffusion region, so that line end 26a is a distance d beyond the diffusion region. This extension length d beyond the gate is selected by the integrated circuit designer based on various conventional design manual criteria, for example, to accommodate overlay shifts between contacts on layers above and below the layer depicted in FIG. 1.

Figure 2:
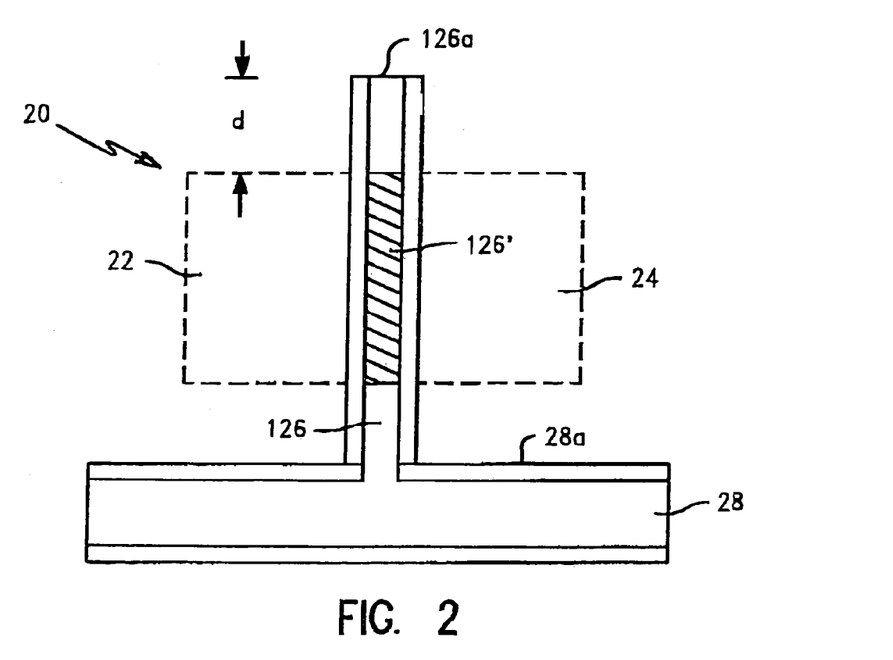
FIG. 2 is a top plan view of a re-design of the transistor of FIG. 1, wherein one of the lines is replaced with a critical width line, to create a gate-shrink region.
Figure 3:
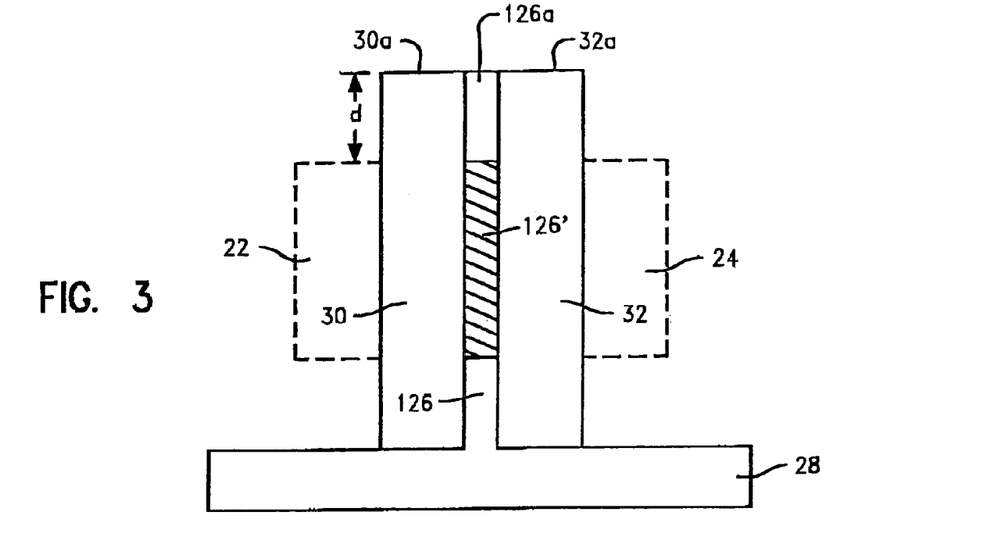
FIG. 3 is a top plan view of a re-design of the transistor of FIG. 2, showing the ideal layout of alternating phase shifting segments to create the critical width line, including a gate-shrink region.

In order to improve the performance of the transistor, the integrated circuit designer may determine that the width of transistor gate 26' (in the horizontal direction as depicted in the figures) needs to be reduced. Accordingly, this gate-shrink design is depicted in FIG. 2, where line 126 forming the gate, extending perpendicularly from line 28, is considerably reduced in width along its entire length so that gate region 126' is also reduced in width. The length of line 126 is not affected by this gate-shrink redesign and still has end 126a extending distance d beyond the diffusion region 22, 24. In such redesign the designer may optionally increase the width of line 28 as depicted by 28a.

Where the width of gate-shrink 126' is at the critical dimension (also referred to herein as the critical width), for example a width of about 60 nm (approximately 0.25× (wavelength/numerical aperture)), it becomes necessary to utilize alternating phase shifting mask segments in order to obtain the lithographic resolution needed to create the critical width gate. (As used herein, critical dimension refers to any dimension smaller than the smallest dimension that can be printed within a specified tolerance by a lithographic process without the need for a resolution enhancement technique such as alternating phase shift mask lithography). As shown in FIG. 3, alternating phase shifting segment 30 and 32 have the shape depicted therein in order to shift the phase of the visible or ultraviolet light used in lithographic exposure of the resist layer, and cause a 180° phase differential. This results in the destructive interference that prints line 126 with the desired critical width. The difference in phase shifting is depicted by the different direction of the diagonal lines between phase shifting segments 30 and 32. If, for example, phase shifting segment 30 imparts a 0° phase shift to the light, region 32 would impart a 180° phase shift to the light. Likewise, if region 30 imparted a 90° phase shift to the light, region 32 would impart a 270° phase shift to the light. The alternating phase shifting regions 30 and 32 shrink the width of the entire length of line 126, to avoid introducing jogs into the line design, which may introduce other problems. As a result, the length of the phase shifting segments 30, 32 (in the vertical direction as shown in the figure) is essentially the same as that of the line 126 whose image is to be projected, and the phase shifting shapes have ends 30*a* and 32*a* also extending a distance d beyond diffusion region 22, 24. The width of the phase shifting segments 30, 32 (horizontally as shown in the figure) may be varied depending on the lithographic parameters and type of phase shifting mask material employed, and has a minimum phase width for the wafer, mask and lithographic system utilized. The phase-to-phase space, or distance between phase shifting regions, also may be varied and also has a minimum depending on the system utilized.

Figure 4:
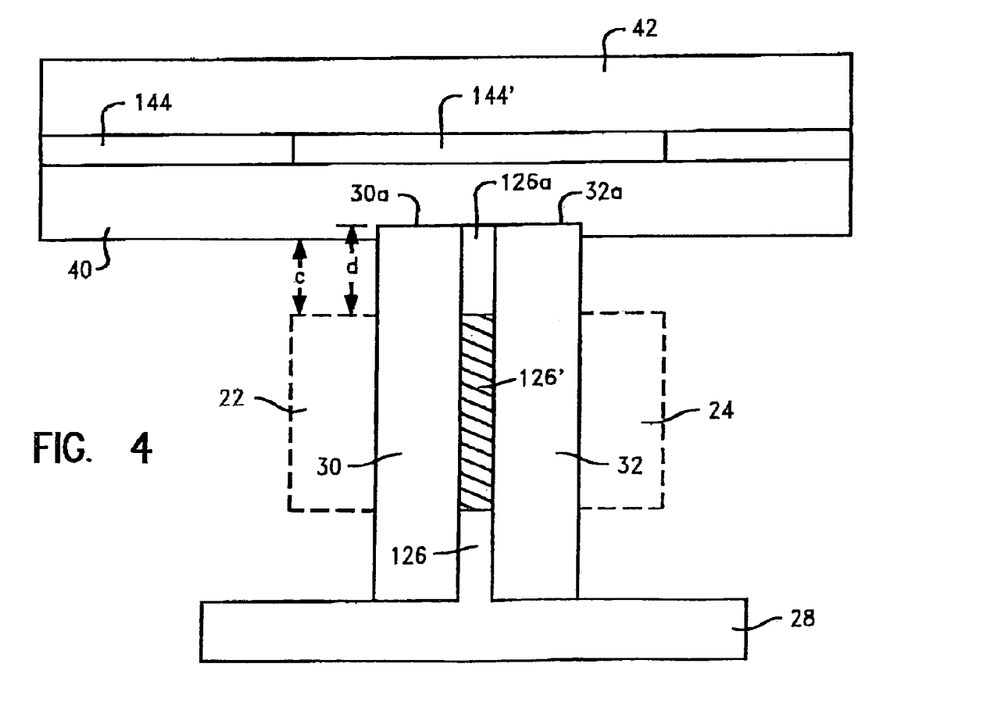
FIG. 4 is a top plan view of the alternating phase shifting segments of FIG. 3 in conflict with alternating phase shifting segments used to create another device.

While FIG. 3 depicts the ideal alternating phase shifting segments 30 and 32 for gate-shrink line 126, typically other alternating phase shifting segment shapes may be simultaneously designed for other nearby features in the integrated circuit design. Such alternating phase shifting segment shapes for other features are shown in FIG. 4, wherein alternating phase shifting segments 40 and 42 having the shapes shown are designed to create and project the image for a line 144 having a gate region 144'. As with alternating phase shifting segments 30 and 32, alternating phase shifting segments 40 and 42 impart light transmission with a 180° phase shift as indicated by the different diagonal hatched lines. While the alternating phase shifting segment shapes for the two line 126 and 144 were designed in isolation, i.e., without considering other nearby features, when combined in a mask design to reflect the actual confluence of lines 126 and 124, there can be identified a conflict between the different alternating phase shifting segment shapes. Such a conflict is identified in the overlapping regions of the two different sets of alternating phase shifting segment shapes 30, 32 and 40, 42. Preferably for phase mask correctness, phase shifting segment shapes 30 and 32, have ends 30*a* and 32*a* respectively at a distance d from diffusion regions 22, 24, to allow for a gate extension to the end of the line, and a legal phase-to-phase end space of at least c to allow for a maximum gate extension past diffusion, plus a legal phase-to-phase end. When the space is smaller, phase shifters that are generated independently for each individual gate interact, causing a phase coloring conflict. To avoid such conflict, either edge 40*a* of phase shifting segment 40 or phase end edge 32*a* of alternating phase shifting segment 32 should be retracted to effect a separation. This retraction should be implemented within the constraints of mask and lithographical rules, i.e., one could not arbitrarily narrow the width of the phase shifter.

Figure 5:
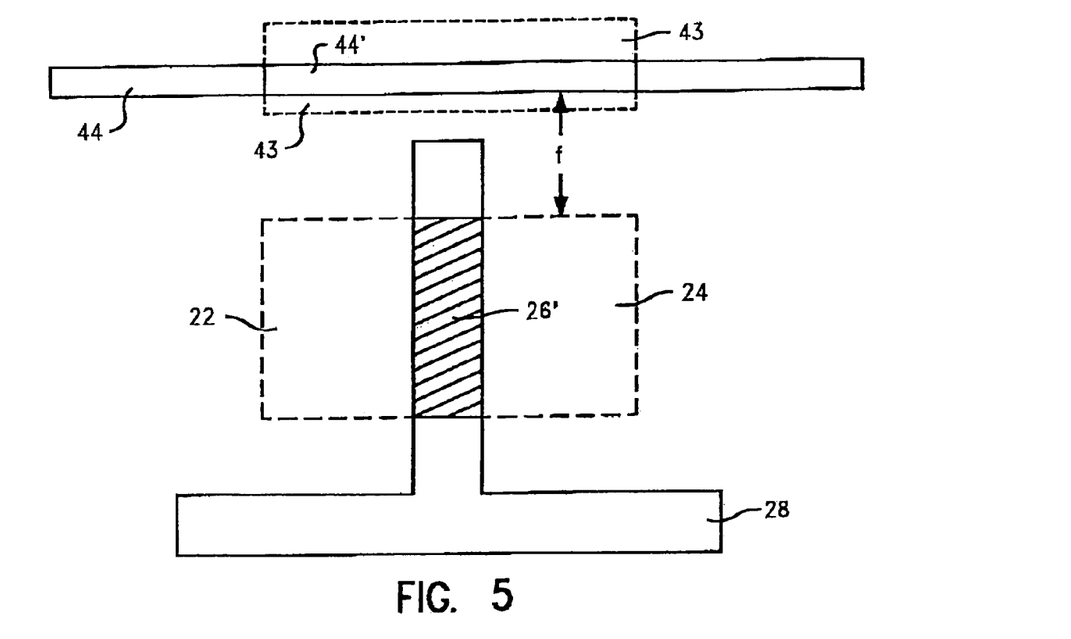
FIG. 5 is a top plan view of the device design, incorporating non-critical width lines, intended to be re-designed and projected by the alternating phase shifting segments of FIG. 4.

In accordance with the present invention, prior to generating the alternating phase shifting mask layout, there should be identified potential phase conflict areas based on relatively simple design rules. FIG. 5 depicts the features that are to be printed by the alternating phase shifting regions 40, 42 of FIG. 4. As shown in FIG. 5, where line 44 passes through transistor diffusion region 43 to form gate 44', there is distance f between line 44 and diffusion regions 22, 24. If this distance f, from the gate end to a perpendicular gate space is less than the phase width plus the phase-to-phase space plus the full phase extension beyond the diffusion region, a conflict exists under the design rules of the present invention. For the layout of FIG. 5 to work, distance f would have to be at least the sum of the minimum phase width (down from gate 44') plus one minimum phase-to-phase space (to properly separate the phase shape from the horizontal gate 44' and the vertical gate 26') plus the phase extension needed beyond diffusion regions 22, 24. This extension may have some maximum value determined by the system utilized. If space f is less than this sum, the phase shifting segments or shapes for projecting gates 44' and 26' will merge, and thus conflict.

Figure 6:
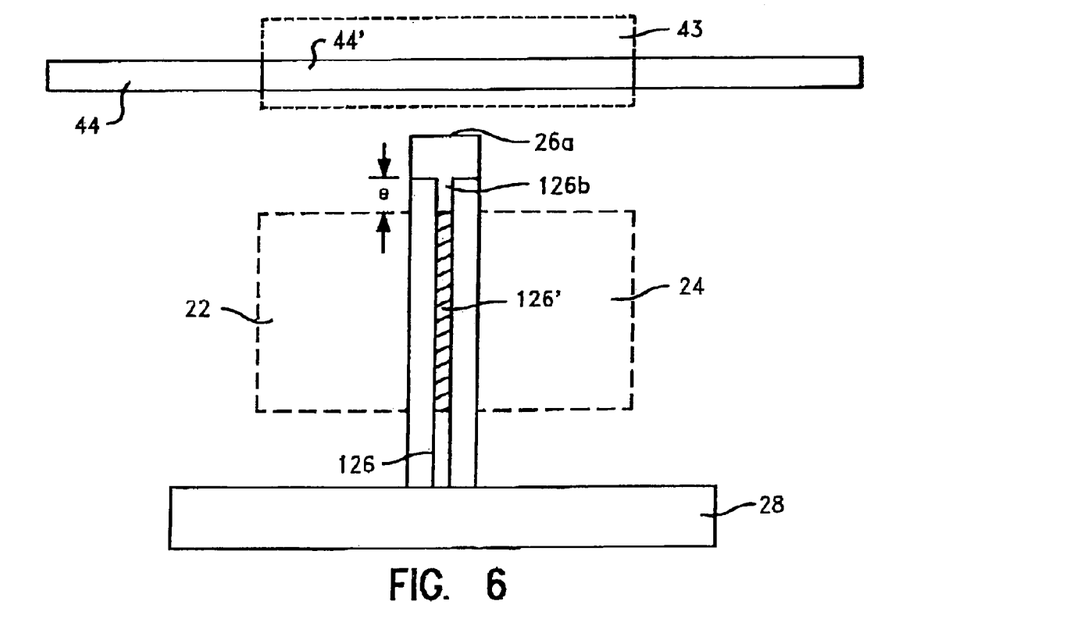
FIG. 6 is a top plan view of a re-design of the devices of FIG. 5, wherein a portion of the critical width line is re-designed and replaced with a non-critical width line portion.

In the example depicted in FIGS. 4 and 5, such a conflict does exist with the printing of gate line 126. To resolve the conflict, as shown in FIG. 6, line 126 is redesigned to have a restricted gate-shrink extension beyond the poly diffusion intersection, i.e., the end of diffusion regions 22, 24 in the direction of the detected conflict. In this example, the line design is altered so that the decreased width line 126 extends only a distance e beyond diffusion regions 22, 24, and the remainder of the line extending to end 26*a* has its original larger width, before the gate-shrink alteration was made. The calculation of a smaller distance e that produces the minimum tolerable gate-shrink extension beyond the diffusion region to avoid a conflict is based on process assumptions, for example, polysilicon-diffusion overlay and phase-end shortening effects. If the jog from the narrow width polysilicon line 126' to the wider polysilicon line 26*a* is too close to the edge of the diffusion regions 22, 24, a displacement due to wafer overlay errors could move the jog over the active area of the gate, causing poor channel length control. Also, since the narrow gate portion of the polysilicon line is imaged by two juxtaposed rectangular phase shapes, any patterning errors on those phase shapes could result in channel length variation. In general, the most prominent patterning problems are corner rounding and shortening of the phase shapes, both requiring the phase shapes to extend a distance beyond the edge of the diffusion region. Accordingly, the critical width of line 126 which forms gate 126', needs to extend only to end 126*b* which is distance e from the diffusion region.

Figure 7:
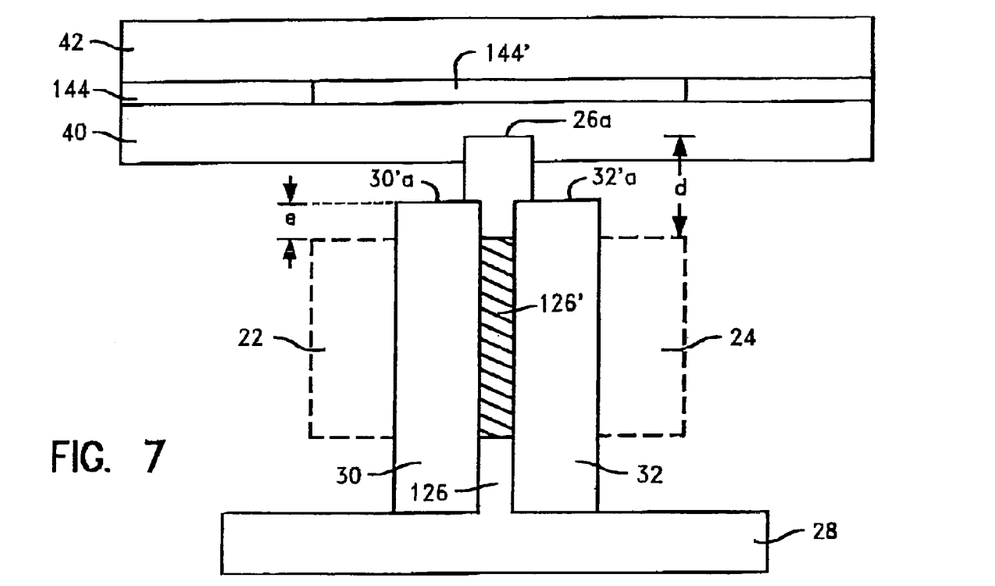
FIG. 7 is a top plan view showing the layout of alternating phase shifting segments to create the re-design of the devices of FIG. 6.

In view of the design change to line 126, the distance that alternating phase shifting segments 30 and 32 need to extend beyond the diffusion region is also reduced, as depicted in FIG. 7. There, alternating phase shifting region ends 30'*a* and 32'*a* extend only a distance e beyond diffusion regions 22, 24, while end 26*a* of line 126 extends the original design distance d. Since the alternating phase shifting segment 30, 32 will not project any line image essentially beyond the distance e, to project the remaining portion of line 126 through end 26*a* at its wider width, a conventional opaque mask segment is employed, such as a chrome on glass (COG) mask segment. This COG mask segment may be placed on the alternating phase shifting mask or on a secondary trim mask to be used in sequence with the alternating phase shifting mask. The resulting alternating phase shifting segment designs shown in FIG. 7 contain the phase shape generation, 30, 32, within the reduced gate-shrink region and avoid a phase conflict with alternating phase shifting segment 40.

Figure 8:
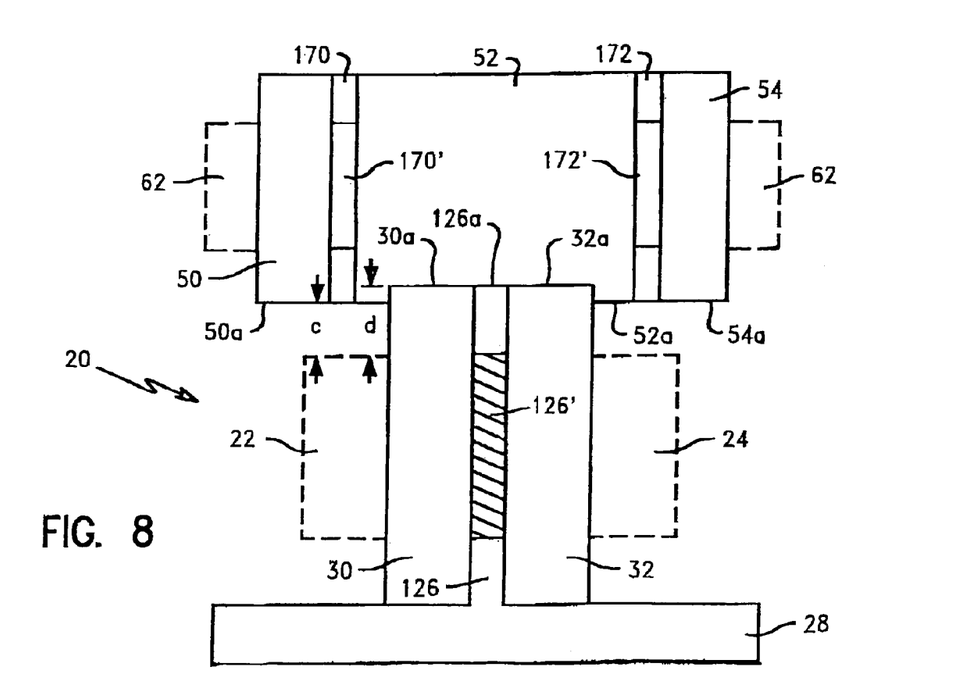
FIG. 8 is a top plan view of the alternating phase shifting segments of FIG. 3 in conflict with another set of alternating phase shifting segments used to create another device.

Another conflict between alternating phase shifting segments is depicted in FIG. 8. In this instance, alternating phase shifting segments 50, 52 and 54, were ideally designed in isolation to create reduced width lines 170, 172 and produce gate-shrink regions 170' and 172' respectively. When combined with the alternating phase shifting regions for original transistor 20, a conflict occurs. Specifically, near ends 50a, 52a and 54a of alternating phase shifting segments 50, 52 and 54, respectively, when ideally positioned, are distance c from diffusion regions 22, 24, which distance is less than distance d over which the alternating phase shifting segment 30, 32 extend from the same diffusion region. Thus, a conflict exists between alternating phase shifting segment end 52a and alternating phase shifting segment ends 30a and 32a.

Figure 9:
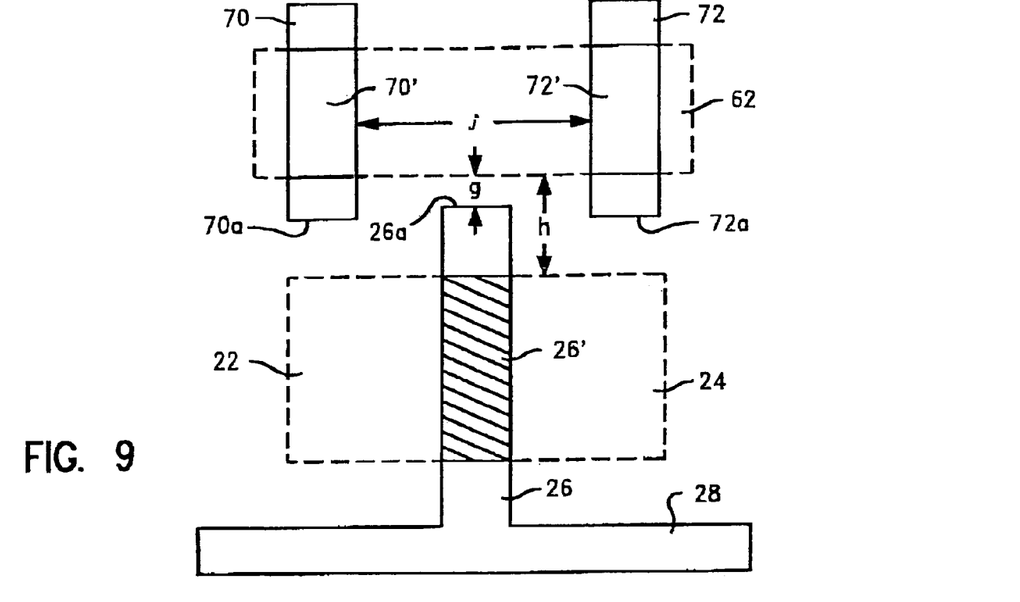
FIG. 9 is a top plan view of the design of the devices intended to be projected by the conflicted alternating phase shifting segments of FIG. 8, using non-critical width lines.

FIG. 9 depicts the features that are to be printed by the alternating phase shifting regions 50, 52, 54 of FIG. 8. Parallel lines 70, 72 of conventional width pass through diffusion region 62 and form gate regions 70', 72', respectively. Diffusion region 62 is spaced from diffusion regions 22, 24 by distance h. Gates 70', 72' are spaced by distance j, and line end 26a is closest to diffusion region 62 and separated therefrom by distance g. In this instance, the identification of potential phase shift conflict areas is based on more elaborate rules than those used in the previous example. For example, the design rules detect a conflict if the space between gate end and the space between parallel gates at the separation is less than that of two times the phase width plus the phase space, and less than the phase space plus two times the full phase extension. In other words, if gates 70' and 72' are separated by less than two minimum phase widths plus one minimum phase-to-phase space, the entire space j will be filled by one continuous phase shifting segment or shape, thereby preventing any phase transition in this region. If line end 26a is too close to this space that is entirely filled by a continuous phase shape, it will be forced to have the same phase on both sides of the line, which is an error. If gates 70', 72' are spaced far enough apart that the space identified by j can support a phase transition, line end 26a can penetrate into this space without a conflict of the two different phase shapes need to project it. Given that distance j is too small to allow two different phase shapes with proper spacing, the bottom gate 26' and top gates 70', 72' need to be independently phase shiftable, i.e., the phase shapes of gate 26' need to be one minimum phase-to-phase space removed from the top phase shapes. Phases from the bottom 26 and top 70, 72 lines merge if space h is less than two times the distance that the phase is extended beyond the edge of their respective diffusion regions (which could be to the end of the lines 26a, 70a, 72a, respectively) plus one minimum phase-to-phase space.

Figure 10:
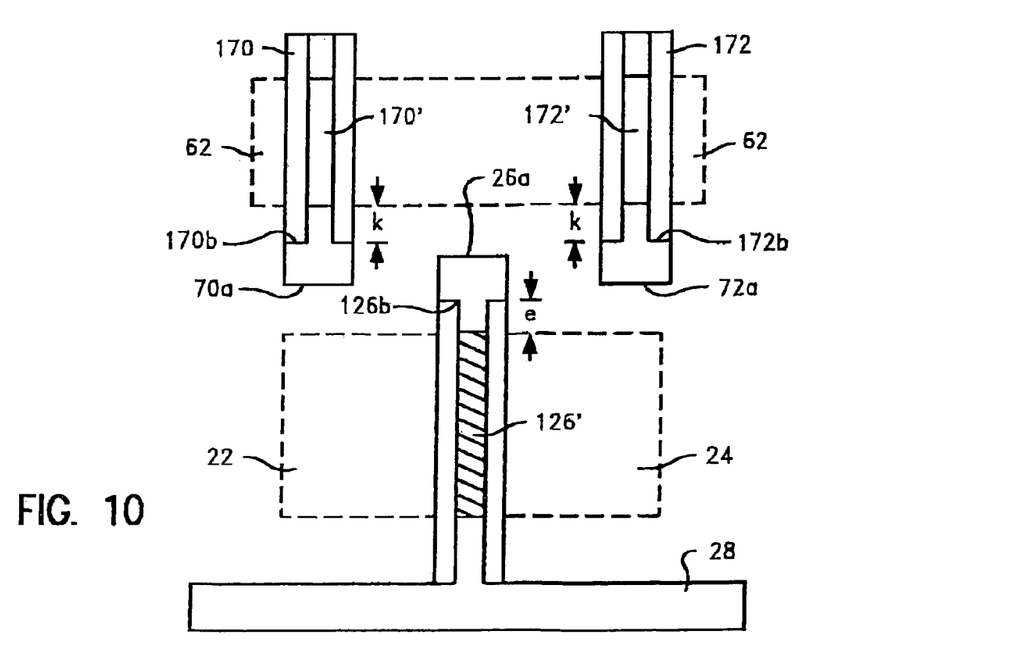
FIG. 10 is a top plan view of a re-design of the devices of FIG. 9, wherein a portion of the non-critical width lines are re-designed and replaced with a critical width line portion, including gate-shrink regions.

To resolve the conflict, the portions of the gate lines which are narrowed to the critical width are reduced in length, based on process assumption such as the polysilicon/diffusion overlay and phase-end shortening effects as described previously. The extension of critical width line 126 beyond the gate-shrink portion 126' is again restricted so that the end 126b of the critical width portion is distance e beyond the polysilicon diffusion intersection, in the direction of the detected conflict. Likewise, for gate-shrink regions 170', 172', the extension of critical width lines 170, 172 beyond diffusion region 62 is also restricted so that the extension of the ends 170b, 172b of the critical width portion of the lines is reduced to distance k beyond diffusion region 62, in the direction of the detected conflict. This leaves for all three extensions from the gate-shrink regions 126', 170' and 172', the end portions 26a, 70a, 72a remaining at their original widths, which are considerably wider than the critical width dimension. While this introduces jogs into the layout of the line, such jogs are a necessary trade-off and reduce the more serious conflicts of the alternating phase shift mask segment which would be introduced otherwise.

Figure 11:
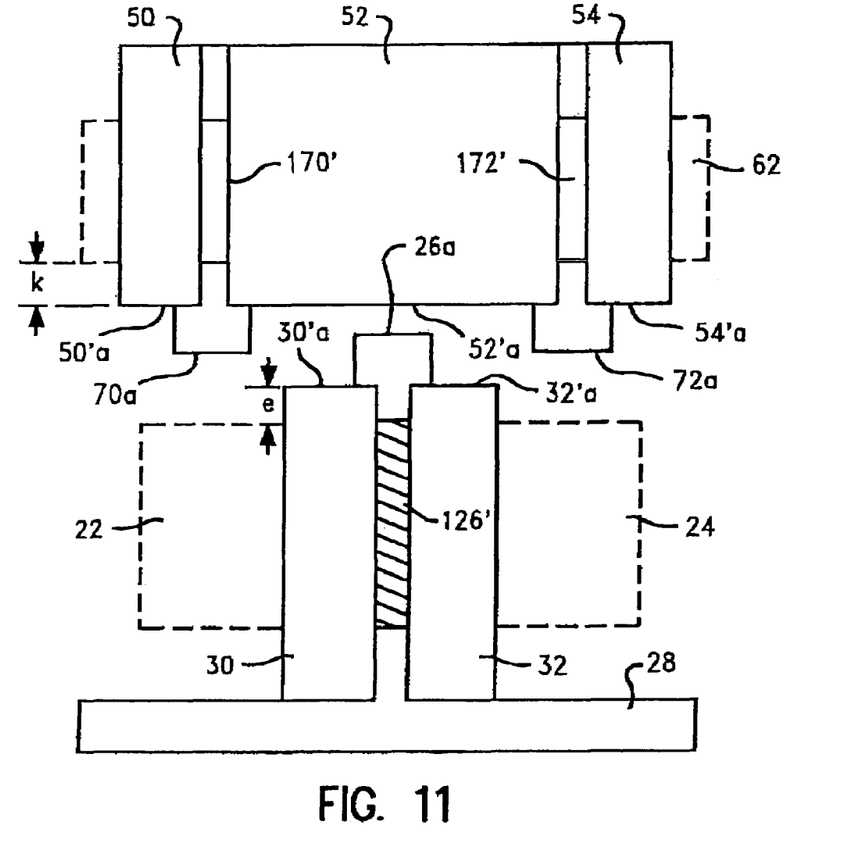
FIG. 11 is a top plan view showing the layout of alternating phase shifting segments to create the re-design of the devices of FIG. 10.

The changes in the alternating phase shifting segments is shown in FIG. 11, where segments 30 and 32 have ends 30'a and 32'a, respectively, at a distance e from diffusion regions 22, 24. Segments 50, 52 and 54 have ends 50'a, 52'a and 54'a, respectively, at a distance k from diffusion region 62. No conflict now exists between the alternating phase shifting segments. As before, the wider line end portions 26a, 70a, 72a are projected by conventional COG formed onto a mask. In this example as before, the phase shift generation is contained within the reduced gate-shrink region to avoid a phase conflict.

Figure 12:
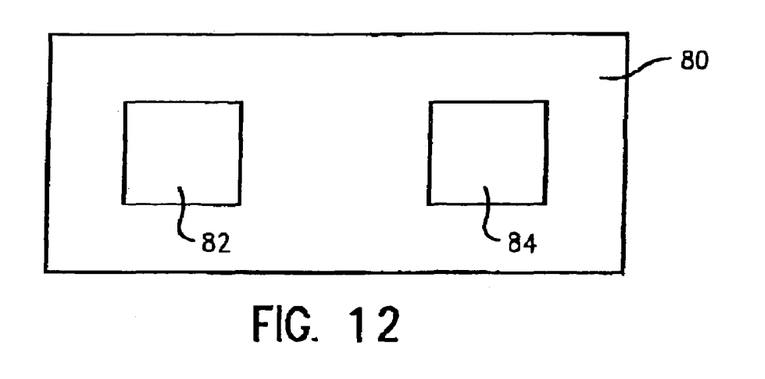
FIG. 12 is a schematic view of an electronic design automation (EDA) tool or computer containing program code for in a program storage device for executing the method of designing an altPSM in accordance with the present invention.

The method of the present invention for designing an alternating phase shifting mask may be implemented by a computer program or software incorporating the process steps and instructions described above in otherwise conventional program code and stored on an electronic design automation (EDA) tool or an otherwise conventional program storage device. As shown in FIG. 12, the program code, as well as any input information required, may be stored in EDA tool or computer 80 on program storage device 82, such as a semiconductor chip, a read-only memory, magnetic media such as a diskette or computer hard drive, or optical media such as a CD or DVD ROM. Computer system 80 has a microprocessor 84 for reading and executing the stored program code in device 82 in the manner described above.

Following design of the layout of the phase shifting segments in accordance with the aforementioned examples, the altPSMs are then fabricated by conventional, well-known methods using the conflict-avoiding alternating phase shifting segment shapes described herein.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

The invention claimed is:

1. A method of designing a layout of an alternating phase shifting mask for projecting an image of an integrated circuit design comprising:

providing a design of an integrated circuit layout having a plurality of features to be projected using alternating phase shifting segments, including a feature having a critical width along a length thereof that extends beyond another feature;

providing alternating phase shift design rules based on alternating phase shift design parameters comprising minimum phase width, minimum phase-to-phase spacing, and minimum extension of critical width beyond another feature;

identifying portions of the integrated circuit layout having a critical width feature that violate the alternating phase shift design rules;

redesigning the critical width feature in the integrated circuit layout that violates the alternating phase shift design rules by reducing the length that the critical width feature extends beyond the other feature to the minimum extension; and generating an alternating phase shifting mask layout with the reduced length of the critical width feature in conformance with the alternating phase shift design rules.

2. The method of claim 1 wherein the feature having a critical width along a length thereof comprises a gate-shrink region of a transistor, and wherein the other feature is a diffusion region of a transistor.

3. A method of designing an alternating phase shifting mask for projecting an image of an integrated circuit design comprising:

providing a design of an integrated circuit layout having a plurality of features to be projected using alternating phase shifting segments, including a feature having a critical width along a length thereof;

for each of said features, determining ideal alternating phase shifting segments shapes to be included in an alternating phase shifting mask for projecting the feature;

identifying a conflict between an alternating phase shifting segment shape for the feature having the critical width along a length thereof and another alternating phase shifting segment shape, prior to fabricating the alternating phase shifting mask;

restricting length of the alternating phase shifting segment shape for the feature having the critical width along a length thereof to eliminate the conflict; and fabricating the alternating phase shifting mask with the restricted length of the alternating phase shifting segment shape for projecting the feature having the critical width along a length thereof.

4. The method of claim 3 wherein the feature having a critical width along a length thereof comprises a gate-shrink region of a transistor.

5. The method of claim 3 wherein restricting length of the alternating phase shifting segment shape for the gate-shrink region of a transistor comprises reducing the length of the critical width portion of the gate-shrink region.

6. The method of claim 3 wherein restricting length of the alternating phase shifting segment shape for the feature having the critical width along a length thereof comprises reducing the length of the critical width portion of the feature.

7. The method of claim 3 wherein restricting length of the alternating phase shifting segment shape for the feature having the critical width along a length thereof comprises restricting the length of the critical width portion of the feature in accordance with design rule tolerances.

8. The method of claim 7 further including fabricating a mask with an opaque shape for projecting the portion of the feature length not projected by the restricted length of the alternating phase shifting segment shape.

9. The method of claim 3 further including fabricating a mask with an opaque shape for projecting the portion of the feature length not projected by the restricted length of the alternating phase shifting segment shape.

10. The method of claim 3 further including restricting length of the other alternating phase shifting segment shape to eliminate the conflict.

11. The method of claim 7 further including restricting length of the other alternating phase shifting segment shape to eliminate the conflict.

12. The method of claim 3 wherein the other alternating phase shifting segment shape is for projecting a gate-shrink region of a transistor, and further including restricting length of the other alternating phase shifting segment shape to eliminate the conflict.

13. The method of claim 4 wherein the other alternating phase shifting segment shape is for projecting a gate-shrink region of a transistor, and further including restricting length of the other alternating phase shifting segment shape to eliminate the conflict.

14. The method of claim 5 wherein the other alternating phase shifting segment shape is for projecting a gate-shrink region of a transistor, and further including restricting length of the other alternating phase shifting segment shape to eliminate the conflict.

15. The method of claim 4 wherein the gate-shrink region of a transistor to be projected has a portion at the critical width and a portion at a wider, non-critical width, and further including fabricating a mask having an opaque portion to project the non-critical width portion of the gate-shrink region.

16. The method of claim 3 wherein the feature having the critical width along a length thereof to be projected has a portion at the critical width and a portion at a wider, non-critical width, and further including fabricating a mask having an opaque portion to project the non-critical width portion of the feature.

17. A program storage device readable by a machine, tangibly embodying a program of instructions executable by the machine to perform method steps for designing a layout of an alternating phase shifting mask, the integrated circuit layout having a plurality of features to be projected using alternating phase shifting segments, including a feature having a critical width along a length thereof that extends beyond another feature, the alternating phase shifting mask to be used to project an image of an integrated circuit design, said method steps comprising:

providing alternating phase shift design rules based on alternating phase shift design parameters comprising minimum phase width, minimum phase-to-phase spacing, and minimum extension of critical width beyond another feature;

identifying portions of the integrated circuit layout having a critical width feature that violate the alternating phase shift design rules;

redesigning the critical width feature in the integrated circuit layout that violates the alternating phase shift design rules by reducing the length that the critical width feature extends beyond the other feature to the minimum extension; and generating an alternating phase shifting mask layout with the reduced length of the critical width feature in conformance with the alternating phase shift design rules.

18. The program storage device of claim 17 wherein the feature having a critical width along a length thereof comprises a gate-shrink region of a transistor, and wherein the other feature is a diffusion region of a transistor.

19. An article of manufacture comprising a computer-usable medium having computer readable program code means embodied therein for designing a layout of an alternating phase shifting mask, the integrated circuit layout having a plurality of features to be projected using alternating phase shifting segments, including a feature having a critical width along a length thereof that extends beyond another feature, the alternating phase shifting mask to be used to project an image of an integrated circuit design, the computer readable program code means in said article of manufacture comprising:

computer readable program code means for providing alternating phase shift design rules based on alternating phase shift design parameters comprising minimum phase width, minimum phase-to-phase spacing, and minimum extension of critical width beyond another feature;

computer readable program code means for identifying portions of the integrated circuit layout having a critical width feature that violate the alternating phase shift design rules;

computer readable program code means for redesigning the critical width feature in the integrated circuit layout that violates the alternating phase shift design rules by reducing the length that the critical width feature extends beyond the other feature to the minimum extension; and computer readable program code means for generating an alternating phase shifting mask layout with the reduced length of the critical width feature in conformance with the alternating phase shift design rules.

20. The article of claim 19 wherein the feature having a critical width along a length thereof comprises a gate-shrink region of a transistor, and wherein the other feature is a diffusion region of a transistor.

* * * * *